United States Patent
Zhou (10) Patent No.: US 11,329,054 B2
(45) Date of Patent: May 10, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 454 days.

(21) Appl. No.: 16/535,603

(22) Filed: Aug. 8, 2019

(65) Prior Publication Data
US 2020/0075601 A1      Mar. 5, 2020

(30) Foreign Application Priority Data

Aug. 29, 2018    (CN) .......................... 201810993225.X (51) Int. Cl.
*H01L 27/11* (2006.01)
*H01L 27/02* (2006.01)
(Continued)

(52) U.S. Cl.
CPC ..... *H01L 27/1104* (2013.01); *H01L 21/31111* (2013.01); *H01L 21/31144* (2013.01); *H01L 21/823814* (2013.01); *H01L 21/823821* (2013.01); *H01L 21/823871* (2013.01); *H01L 21/823878* (2013.01); *H01L 27/0207* (2013.01); *H01L 27/0924* (2013.01);
(Continued)

(58) Field of Classification Search
CPC ........... H01L 27/1104; H01L 21/31111; H01L 21/31144; H01L 21/823814; H01L 21/823821; H01L 21/823871; H01L 21/823878; H01L 27/0207; H01L 27/0924; H01L 29/0653; H01L 29/0847; H01L 29/45; H01L 21/823475; H01L 29/66795; H01L 29/785; H01L 29/0684
See application file for complete search history.

(56) References Cited

U.S. PATENT DOCUMENTS 9,911,736 B1 * 3/2018 Zang ................. H01L 29/78651
2019/0164838 A1 * 5/2019 Chang ................. H01L 29/0649

* cited by examiner

*Primary Examiner* — Karen Kusumakar
*Assistant Examiner* — Adam S Bowen
(74) *Attorney, Agent, or Firm* — Anova Law Group, PLLC (57) ABSTRACT

A semiconductor device and a fabrication method are provided. The method includes providing a substrate; forming a first gate structure and source/drain doped layers over the substrate, where the source/drain doped layers are on both sides of the first gate structure; forming a dielectric layer covering the first gate structure and the source/drain doped layers over the substrate; forming a first trench exposing the first gate structure through the dielectric layer; forming a first conductive structure in the bottom region of the first trench; after forming the first conductive structure, forming an insulation layer in the top region of the first trench; using the insulation layer as a mask, forming recesses on source/drain doped layers through the dielectric layer on both sides of the insulation layer; and forming second conductive structures in the recesses.

20 Claims, 7 Drawing Sheets

(51) Int. Cl.
*H01L 27/092* (2006.01)
*H01L 29/06* (2006.01)
*H01L 29/08* (2006.01)
*H01L 21/8238* (2006.01)
*H01L 21/311* (2006.01)
*H01L 29/45* (2006.01)

(52) U.S. Cl.
CPC ...... *H01L 29/0653* (2013.01); *H01L 29/0847* (2013.01); *H01L 29/45* (2013.01)

SEMICONDUCTOR DEVICE AND FABRICATION METHOD THEREOF

CROSS-REFERENCE TO RELATED APPLICATION

This application claims the priority of Chinese Patent Application No. 201810993225.X, filed on Aug. 29, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, the semiconductor devices present a development trend of high element density and high integration. Currently, the semiconductor devices, as the most basic devices, are widely used. The conventional planar devices have weak control on channel current, which may cause the short-channel effect and leakage current, thereby affecting the electrical performance of the semiconductor devices.

In order to overcome the short-channel effect and control the leakage current, a fin field effect transistor (FinFET), which is a common multi-gate device, has been used in the conventional technology. The structure of the FinFET may include fins and an isolation layer on a semiconductor substrate surface, gate structures on a top surface of the isolation layer and on top surfaces and sidewall surfaces of the fins, and source regions and drain regions in the fins on both sides of the gate structures. The isolation layer may cover a portion of the sidewalls of the fin, and the top surface of the isolation layer may be lower than the top surface of the fin.

However, the semiconductor devices formed by the conventional technology may have poor performance.

SUMMARY

One aspect of the present disclosure provides a method for fabricating a semiconductor device. The method includes providing a substrate; forming a first gate structure and source/drain doped layers over the substrate, where the source/drain doped layers are on both sides of the first gate structure; forming a dielectric layer covering the first gate structure and the source/drain doped layers over the substrate; forming a first trench exposing the first gate structure through the dielectric layer; forming a first conductive structure in the bottom region of the first trench; after forming the first conductive structure, forming an insulation layer in the top region of the first trench; using the insulation layer as a mask, forming recesses on source/drain doped layers through the dielectric layer on both sides of the insulation layer; and forming second conductive structures in the recesses.

Another aspect of the present disclosure provides a semiconductor device fabricated by embodiments of the present disclosure. The semiconductor device includes a substrate; a first gate structure and source/drain doped layers over the substrate, where the source/drain doped layers are on both sides of the first gate structure; a dielectric layer over the substrate, where the dielectric layer covers the first gate structure and the source/drain doped layers; a first trench exposing the first gate structure in the dielectric layer, where the first trench includes a bottom region and a top region on the bottom region, a size of the top region is larger than a size of the bottom region in a direction parallel to a surface of the substrate, and a sidewall of the top region is concave with respect to a sidewall of the bottom region; a first conductive structure in the bottom region of the first trench; an insulation layer in the top region of the first trench, where a material of the insulation layer is different from a material of the dielectric layer; and second conductive structures which are in the dielectric layer on both sides of the first gate structure and are connected to the source/drain doped layers.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: providing a substrate; forming a first gate structure and source/drain doped layers over the substrate, where the source/drain doped layers are on both sides of the first gate structure; forming a dielectric layer covering the first gate structure and the source/drain doped layers over the substrate; forming a first trench exposing the first gate structure through the dielectric layer; forming a first conductive structure in the bottom region of the first trench; after forming the first conductive structure, forming an insulation layer in the top region of the first trench; using the insulation layer as a mask, forming recesses on source/drain doped layers through the dielectric layer on both sides of the insulation layer; and forming second conductive structures in the recesses.

Figure 1:
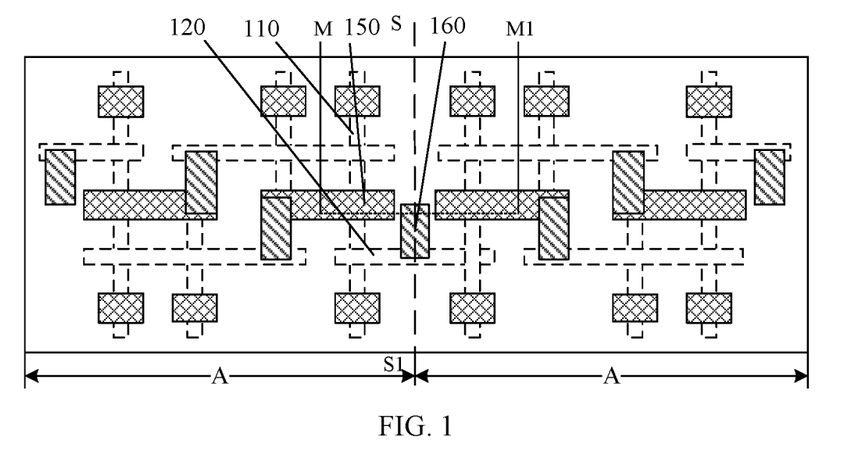
FIGS. 1-2 illustrate structural schematics of a static random-access memory (SRAM) device.
Figure 2:
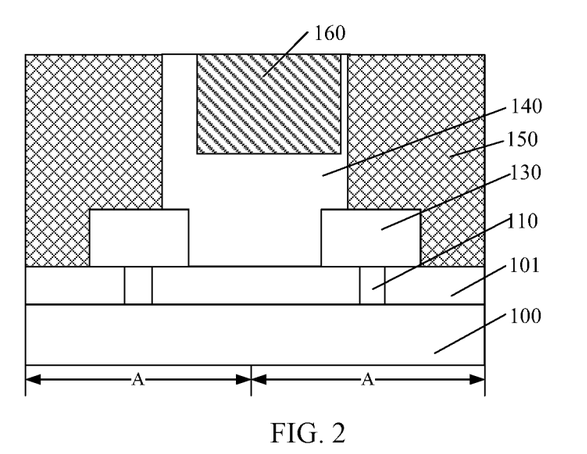

FIGS. 1-2 illustrate structural schematics corresponding to a static random-access memory (SRAM) device.

Referring to FIG. 1 and FIG. 2, a fabrication method of a SRAM device may be provided. FIG. 1 illustrates a top-view schematic of a semiconductor device, and FIG. 2 illustrates a cross-sectional schematic along a cut line M-M1 in FIG. 1. A substrate 100 may be provided and include adjacent device regions A which may be mirror connected along an axis S-S1. A surface of the substrate 100 of the device region A may have fins 110 and an isolation layer 101. The isolation layer 101 may cover a portion of sidewalls of the fins 110, and the fins 110 of the adjacent device regions A may be adjacent to each other. A gate structure 120 may cross the adjacent fins 110 of the adjacent device regions A. Source/drain doped layers 130 may be in the fins 110 on both sides of the gate structure 120 of the device regions A, and at least one doped source/drain layer 130 may be adjacent to another doped source/drain layer 130 of the adjacent device region A. A dielectric layer 140 may be over the substrate and may cover the top of the source/drain doped layers 130 and the top and sidewall surfaces of the gate structure 120. A first conductive structure 150 and a second conductive structure 160 may be in the dielectric layer 140. The first conductive structure 150 may cross the source/drain doped layers 130 and cover a portion of the tops and sidewall surfaces of the source/drain doped layers 130. The second conductive structure 160 may cover a portion of the top surface of the first gate structure 120.

In the above-mentioned embodiments, the first conductive structure may be used to connect a first metal interconnect layer to the source/drain doped layers, and the second conductive structure may be used to connect the first metal interconnect layer to the gate structure. After forming the first conductive structure, the second conductive structure may be formed. When forming the second conductive structure, a photolithography process may be required to form a trench. The position of the trench may be misaligned due to the precision limitation of the photolithography process, so the distances between the trench and each of the two adjacent first conductive structures 150 may not be equal. If the dielectric layer between the second conductive structure 160 and the first conductive structure 150 is too thin, current leakage may be caused easily. Especially the trench is greatly misaligned, a bridging between the first conductive structure 150 and the second conductive structure 160 may also be caused easily, which may result in poor performance of the formed semiconductor device.

The present disclosure provides a fabrication method of a semiconductor device. A first trench may be formed in a dielectric layer, where a top size of the trench may be larger than a bottom size of the first trench. An insulation layer may be formed in a top region and a first conductive structure may be formed in a bottom region. The insulation layer may cover the top surface of the first conductive structure, so the first conductive structure may be protected during the process of forming a second conductive structure. Recesses may be formed using the insulation layer as a mask and the second conductive structures may be formed in the recesses. Therefore, the position of the insulation layer may determine the position of the second conductive structure, and a distance between the first conductive structure and the second conductive structure may be greater than zero. The sizes of the top and bottom regions may be adjusted to implement the isolation between the first conductive structure and the second conductive structure, which may improve the performance of the semiconductor device.

In order to further illustrate the above described objects, features, and advantages of the present disclosure, various specific embodiments of the present disclosure will be described in detail below with reference to the accompanying drawings.

FIGS. 3-12 illustrate structural schematics corresponding to certain stages for forming an exemplary semiconductor device according to various disclosed embodiments of the present disclosure. FIG. 13 illustrates a flowchart of an exemplary fabrication method for forming a semiconductor structure according to various disclosed embodiments of the present disclosure.

Figure 3:
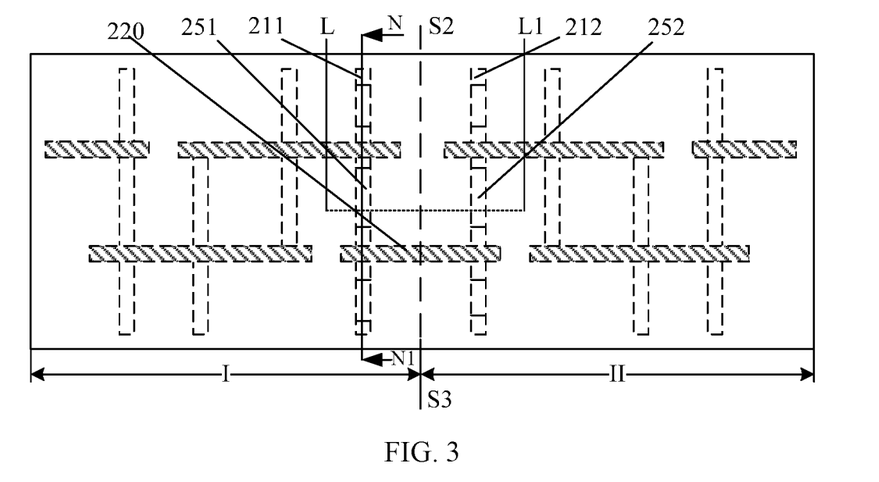
FIGS. 3-12 illustrate structural schematics corresponding to certain stages for forming an exemplary semiconductor device according to various disclosed embodiments of the present disclosure.
Figure 4:
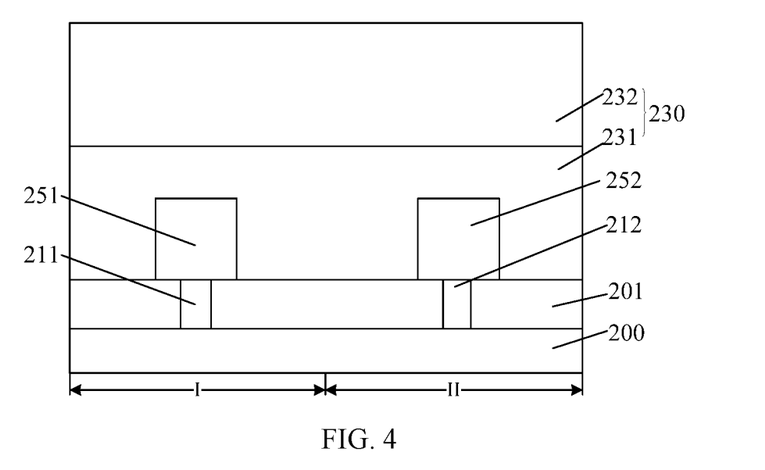
Figure 5:
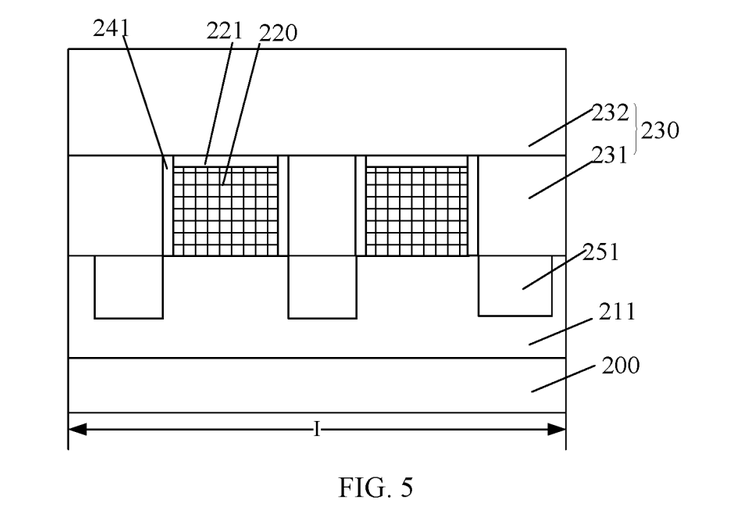

Referring to FIGS. 3-5, FIG. 3 illustrates a top-view schematic of a semiconductor device. FIG. 4 illustrates a cross-sectional schematic along a cut line L-L1 in FIG. 3. FIG. 5 illustrates a cross-sectional schematic along a cut line N-N1 in FIG. 3. A substrate may be provided (e.g., in S401 of FIG. 13).

The substrate may include a base substrate 200.

The base substrate 200 may include adjacent device regions.

Although only a first device region I and a second device region II adjacent to the first device region I are illustrated in FIG. 3, any number of adjacent device regions may be included in the present disclosure. In one embodiment, the first device region I and the second device region II may be mirror distributed along an axis S2-S3 as shown in FIG. 3.

In one embodiment, the first device region I and the second device region II may be used to form a static random-access memory.

In other embodiments, the first device region I and the second device region II may be used to form a p-channel metal-oxide-semiconductor (PMOS) transistor or an n-channel metal-oxide-semiconductor NMOS transistor.

The substrate device regions may include the base substrate and a first fin on the base substrate, and the first fins of adjacent device regions may be adjacent to each other.

In one embodiment, the first device region I may include the base substrate 200 and the first fin 211 on the base substrate 200. The second device region II may include the base substrate 200 and the second fin 212 on the base substrate 200. The first fin 211 and the second fin 212 may be adjacent to each other.

The base substrate 200 may be made of a material including silicon, germanium, silicon germanium, gallium arsenide, indium gallium arsenide, or any other suitable material(s), where the silicon material may include single crystal silicon, polycrystalline silicon or amorphous silicon. The base substrate 200 may also be a semiconductor-on-insulator structure. The semiconductor-on-insulator structure may include an insulator and a semiconductor material layer on the insulator, where the semiconductor material layer may be made of a material including silicon, germanium, silicon germanium, gallium arsenide, indium gallium arsenide, or any other suitable material(s).

In one embodiment, the material of the base substrate 200 may be single crystal silicon.

In one embodiment, the first fin 211 and the second fin 212 may be used as fins of a pass transistor and a pull-down transistor.

In one embodiment, the first fin 211 and the second fin 212 may be formed by patterning the base substrate 200.

In one embodiment, the material of the first fin 211 and the second fin 212 may be single crystal silicon. In other embodiments, the material of the first fin 211 and the second fin 212 may be monocrystalline silicon germanium or any other suitable semiconductor material(s).

In one embodiment, the fabrication method may further include forming an isolation layer 201 on the base substrate 200. The isolation layer 201 may cover a portion of sidewall surfaces of the first fin 211 and the second fin 212. The isolation layer 201 may be made of a material including silicon dioxide.

The first gate structure and the source/drain doped layers may be formed on the substrate, and the source/drain doped layers may be on both sides of the first gate structure (e.g., in S402 of FIG. 13).

In one embodiment, the first gate structure 220 and the source/drain doped layers may be formed on the substrate 200 of the device region.

The first gate structure 220 may cross the first fin 211 of the first device region I and the second fin 212 of the second device region and may cover a portion of the tops and sidewall surfaces of the first fin 211 and the second fin 212.

A first source/drain doped layer 251 may be formed in the first fin 211 on both sides of the first gate structure 220 of the first device region I. A second source/drain doped layer 252 may be formed in the second fin 212 on both sides of the first gate structure 220 of the second device region II. The first source/drain doped layer 251 and the second source/drain doped layer 252 may be adjacent to each other.

In one embodiment, the first gate structure 220 may include a gate dielectric layer and a gate layer on the gate dielectric layer. The gate dielectric layer may be made of a high K (K greater than 3.9) dielectric layer. The gate layer may be made of a metal including tungsten.

The top of the first gate structure 220 may have a first gate protection layer 221.

In one embodiment, the fabrication method may further include a second gate structure on the substrate device region. The second gate structure may cross the first fin and cover a portion of the sidewalls and top surface of the first fin. The first gate structure and the second gate structure may share the source/drain doped layers.

In other embodiments, the second gate structure may not be formed.

A dielectric layer 230 may be formed on the substrate and cover the first gate structure 220, the first source/drain doped layer 251 and the second source/drain doped layer 252 (e.g., in S403 of FIG. 13).

In one embodiment, the dielectric layer 230 may include a first interlayer dielectric layer 231 and a second interlayer dielectric layer 232. The first interlayer dielectric layer 231 may cover the sidewalls of the first gate structure 220, and the second interlayer dielectric layer 232 may cover the top surface of the first gate structure 220.

The fabrication method of forming the first gate structure 220 may include: forming a first dummy gate structure crossing the first fin 211 and the second fin 212 on the base substrate 200; forming the first interlay dielectric layer 231 covering the top and sidewalls of the first fin 211, the top and sidewalls of the second fin 211, and the sidewalls of the first dummy gate structure; after forming the first interlayer dielectric layer 231, forming a gate opening in the first interlayer dielectric layer 231 after removing the first dummy gate structure; and forming the first gate structure 220 in the gate opening.

In one embodiment, the fabrication method may further include forming first spacers 241 which may be on the sidewalls of the first gate structure 210. The top surface of the first gate structure 220 may be coplanar with the top surface of the first spacers 241. The first interlayer dielectric layer 231 may cover the sidewalls of the first spacers 241, and the second interlayer dielectric layer 232 may be on the first spacers 241.

In one embodiment, before forming the first dielectric layer 231, the fabrication method may further include: forming the first source/drain doped layer 251 in the first fin 211 on both sides of the first dummy gate structure; and forming the second source/drain doped layer 252 in the second fin 212 on both sides of the first dummy gate structure.

The first source/drain doped layer 251 and the second source/drain doped layer 252 may be formed by an epitaxial process or an ion implantation process.

In one embodiment, the first source/drain doped layer 251 and the second source/drain doped layer 252 may be formed by an epitaxial process.

Forming the first source/drain doped layer 251 may include: forming a first recess in the first fin 211 on both sides of the first dummy gate structure; and forming the first source/drain doped layer 251 in the first recess using an epitaxial process.

Forming the second source/drain doped layer 252 may include: forming a second recess in the second fin 212 on both sides of the first dummy gate structure; and forming the second source/drain doped layer 252 in the second recess using an epitaxial process.

In one embodiment, the first source/drain doped layer 251 and the second source/drain doped layer 252 may be formed using an ion implantation process.

In one embodiment, the tops of the first source/drain doped layer 251 and the second source/drain doped layer 252 may have a protection layer. The protection layer may protect the first source/drain doped layer 251 and the second source/drain doped layer 252 when forming other different types of doped layers.

The material of the protection layer may be different from the material of the dielectric layer. The protection layer may be made of a material including silicon nitride, silicon oxynitride, silicon oxycarbide, silicon carbonitride or silicon carbon oxynitride.

In one embodiment, the material of the protection layer may be silicon nitride, and the material of the dielectric layer may be silicon oxide. The silicon nitride may have a good etching selectivity with respect to the silicon oxide. Therefore, when etching the dielectric layer, the silicon oxide may be ensured to be removed and the silicon nitride may be less etched simultaneously, thereby better protecting the source/drain doped layers.

The first source/drain doped layer 251 and the second source/drain doped layer 252 may have source/drain ions.

When the semiconductor device is N-type, the conductivity type of the source/drain ions may be N-type, such as phosphorus ions. When the semiconductor device is P-type, the conductivity type of the source/drain ions may be P-type, such as boron ions.

After forming the first gate structure 220, the first source/drain doped layer 251 and the second source/drain doped layer 252, a second dielectric layer 232 may be formed on the first dielectric layer 231 and the first gate structure 220. The second dielectric layer 232 may cover the surface of the isolation layer 201, the surface of the first fin 211, the top surface of the first gate structure 220, the tops and sidewall surfaces of the first source/drain doped layer 251 and the second source/drain doped layer 252.

The second dielectric layer 232 may be used for interlayer isolation.

The second dielectric layer 232 may be made of a material including silicon oxide, silicon nitride, silicon borohydride, silicon oxynitride or silicon oxynitride.

A first trench exposing the first gate structure may be formed in the dielectric layer (e.g., in S404 of FIG. 13). The first trench may include a bottom region and a top region. In a direction parallel to the substrate surface, a size of the top region may be larger than a size of the bottom region. The sidewall of the top region may be concave with respect to the sidewall of the bottom region.

Figure 6:
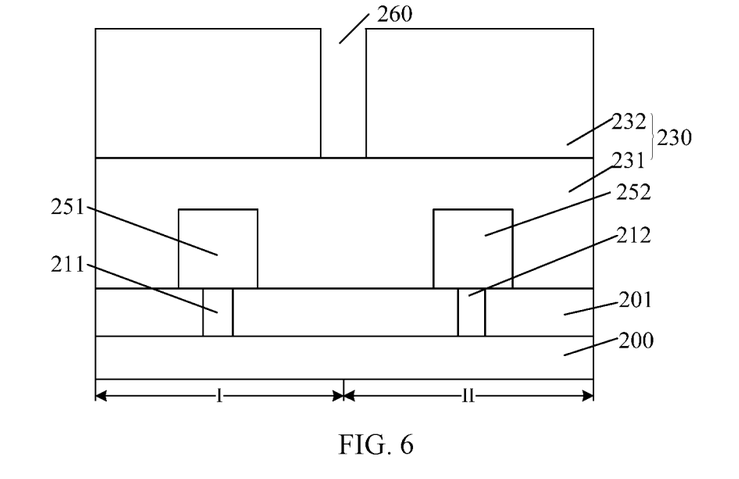

Referring to FIG. 6, FIG. 6 is a schematic based on FIG. 4. a first initial trench 260 may be formed in the dielectric layer 230 and may expose the first gate structure 220.

The first initial trench 260 may provide space for subsequent formation of the first trench.

For example, the dielectric layer 230 may be etched till the top surface of the first gate structure 220 is exposed. The first initial trench 260 crossing the second dielectric layer 232 may be formed in the dielectric layer 230. The first initial trench 260 may also expose a portion of the top surface of the first dielectric layer 231.

The size of the first initial trench 260 may determine the size of the bottom region of the subsequently formed first trench.

In one embodiment, the fabrication method may further include removing the first gate protection layer 221 on the top of the first gate structure 220 to expose the surface of the first gate layer. The first initial trench may expose the top surface of the first gate layer.

Figure 7:
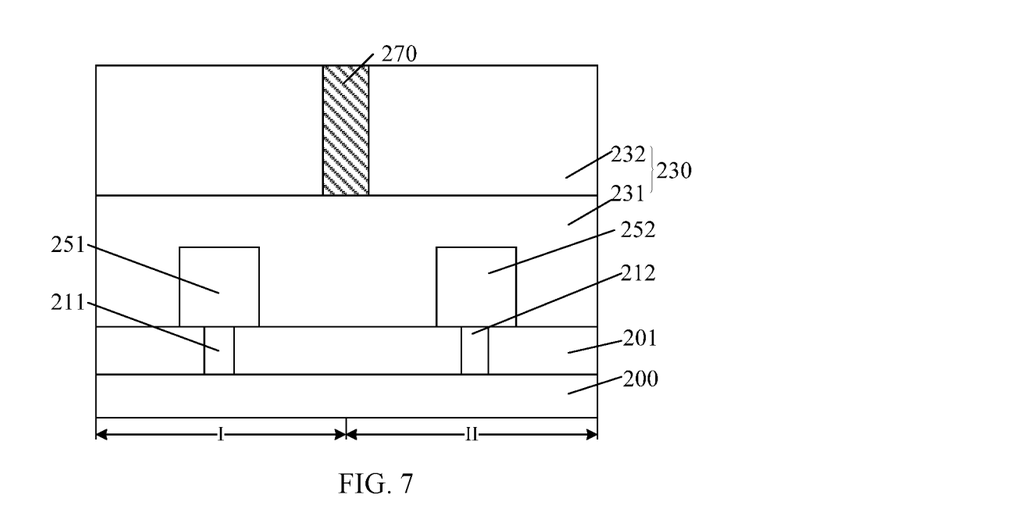

Referring to FIG. 7, after forming the first initial trench 260, a first initial conductive structure 270 may be formed in the first initial trench 260. The top surface of the first initial conductive structure 270 may be coplanar with the top surface of the dielectric layer 230 may.

The first initial conductive structure 270 may cover the first gate layer.

The first initial conductive structure 270 may provide the material for forming the first conductive structure subsequently.

The method of forming the first initial conductive structure 270 may include: forming a first initial conductive material layer (not shown) in the first initial trench 260 and on the dielectric layer 230; planarizing the first initial conductive material layer till the top surface of the dielectric layer 230 is exposed; and forming the first initial conductive structure 270 in the first initial trench 260.

The first initial conductive structure 270 may be made of a metal including tungsten, cobalt, titanium or nickel.

In one embodiment, the material of the first initial conductive structure 270 may be cobalt.

The first initial conductive material layer may be formed by a deposition process including a chemical vapor deposition process, a physical vapor deposition process or an atomic layer deposition process.

Figure 8:
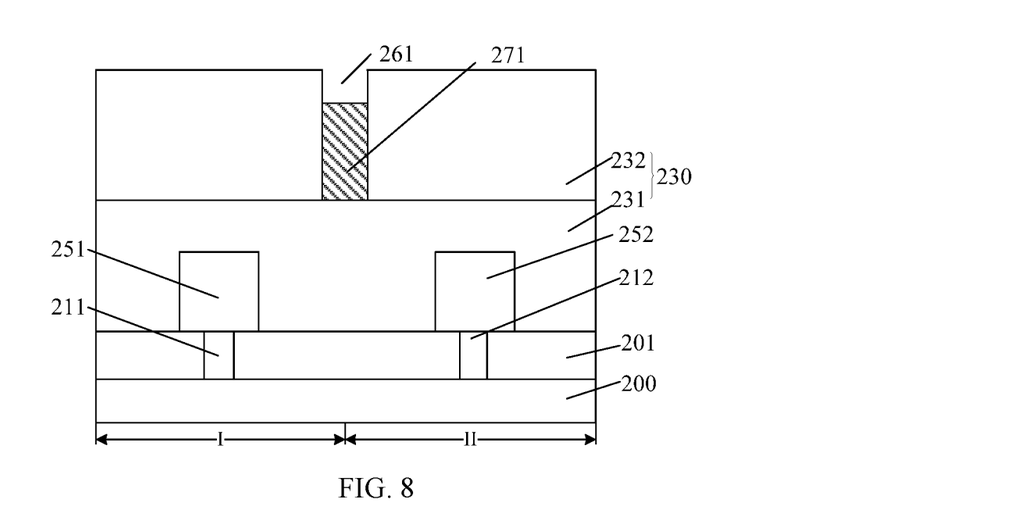

Referring to FIG. 8, after forming the first initial conductive structure 270, a portion of the first initial conductive structure 270 may be etched back to form a first conductive structure 271 (e.g., in S405 of FIG. 13). The top surface of the first conductive structure 271 may be lower than the top surface of the dielectric layer 230.

The first initial trench exposed by the first conductive structure 217 may be a first region 261 of the first initial trench.

During the formation of the first conductive structure 271, the first region 261 of the first initial trench may be formed. The first region 261 of the first initial trench may be on the first conductive structure 271.

The process of etching back a portion of the first initial conductive structure 270 may be a dry etching process or a wet etching process.

In one embodiment, a portion of the first initial conductive structure 270 may be etched back by a dry etching process.

The first initial trench 260 may include a second region and the first region on the first region.

The first region 261 of the first initial trench may provide space for forming a top region of the first trench subsequently.

The second region of the first initial trench may provide space for a bottom region of the first trench.

Figure 9:
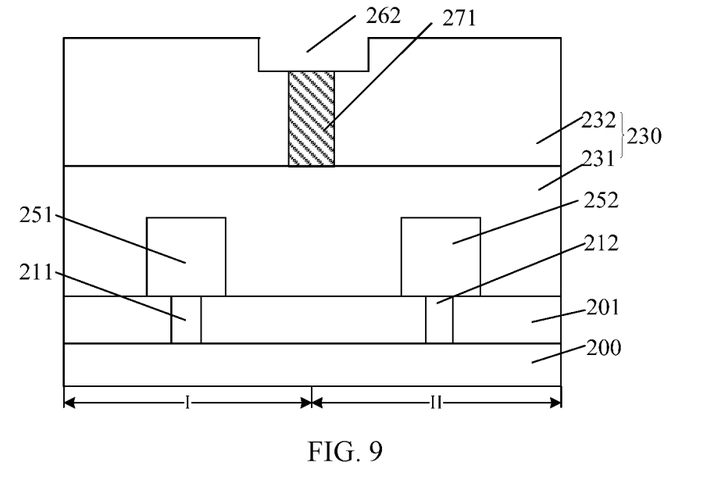

The first conductive structures 271 may in the second region of the first initial trench, Referring to FIG. 9, after forming the first conductive structure 271, the dielectric layer on both sides of the top region of the first initial trench 260 may be etched to form a top region 262 of the first trench. The bottom surface of the top region 262 of the first trench may be coplanar with the top surface of the first conductive structure 271.

The second region of the first initial trench may be the bottom region of the first trench. The first conductive structure 271 may be in the bottom region of the first trench.

A distance between the sidewall of the top region 262 of the first trench and the bottom region of the first trench may be about 3 nm to about 8 nm.

An insulation layer may be formed subsequently in the top region 262 of the first trench. The distance between the edge of the top region 262 of the first trench and the edge of the bottom region of the first trench on the same side may determine the distance between the edge of the insulation layer and the edge of the first conductive structure on the same side, that is, may determine a minimum distance between the second conductive structure subsequently formed and the first conductive structure 271.

In a direction parallel to the substrate surface, the ratio of the size of the bottom region of the first trench to the size of the top region 262 of the first trench may be about 1:1.4 to about 1:2.6.

The size of the top region of the first trench may be about 15 nm to about 40 nm.

If the size of the top region 262 of the first trench is too large, the distance between the second conductive structures subsequently formed may be too large. In such way, the distance between the first source/drain doped layer 251 and the second source/drain doped layer 252 may be far apart, and the distance between the first device region I and the second device region II may be far apart, which may not meet the trend of device miniaturization. If the size of the top region of the first trench is too small, the dielectric layer between the first conductive structure and the second conductive structure may be small, which may have poor isolation performance.

The ratio of the depth of the top region 262 of the first trench to the depth of the first trench may be about 1:2 to about 1:7.

The depth of the top region 262 of the first trench may be about 10 nm to about 50 nm.

The insulation layer may be formed in the top region 262 of the first trench subsequently. The depth of the top region 262 of the first trench may determine the depth of the subsequently formed isolation layer. If the isolation layer is too thin, the insulation effect may be limited, and leakage may occur between the first conductive structure and second conductive structure. If the depth of the top region 262 of the first trench is too large, the size of the first conductive structure may be too small, which may cause poor performance of the formed semiconductor device.

In one embodiment, after forming the top region of the first trench, the bottom region of the first trench may be formed.

The method for forming the first trench may include: forming a first patterned layer on the dielectric layer, where the first patterned layer may expose a portion of the dielectric layer surface; using the first patterned layer as a mask, etching the dielectric layer to form the top region of the first trench; removing the first patterned layer to form a second patterned layer on the dielectric layer, where the second patterned layer may expose a portion of the dielectric layer surface at the bottom of the top region of the first trench; using the second patterned layer as a mask, etching the dielectric layer to form the bottom region of the first trench, where the bottom region of the first trench may be at the bottom of the top region of the first trench.

In one embodiment, the method for forming the first trench may include: forming the first initial trench in the dielectric layer, where the first initial trench may expose the first gate structure; forming a sacrificial layer in the first initial trench, where the top surface of the sacrificial layer may be lower than the top surface of the dielectric layer; forming a first mask layer on the surface of the dielectric layer, where the first mask layer may expose a portion of the dielectric layer surface on both sides of the first initial trench; using the first mask layer as a mask, etching the dielectric layer on both sides of the first initial trench, exposed by the first mask layer, to form the top region of the first trench, where the bottom surface of the top region of the first trench may be coplanar with the top surface of the sacrificial layer; and removing the sacrificial layer to form the bottom region of the first trench after forming the top region of the first trench.

The method for forming the sacrificial layer may include: forming an initial sacrificial material layer in the first initial trench and on the dielectric layer; planarizing the initial sacrificial material layer till the surface of the dielectric layer is exposed to form an initial sacrificial layer; and forming the sacrificial layer by etching back a portion of the initial sacrificial layer.

The sacrificial layer may be made of a material including an organic material.

In one embodiment, the sacrificial layer may be a organic dielectric layer (ODL) material. The initial sacrificial material layer may be formed by a spin coating process.

In some embodiments, the sacrificial layer may be made of a material including a bottom anti-reflective coating (BARC) material or deep UV light absorbing oxide (DUO) material, where the DUO material may be a siloxane polymer material including $CH_3$—$SiO_x$, Si—OH or $SiOH_3$, etc.

In one embodiment, the method for forming the first trench may include: forming a second initial trench in the dielectric layer; and etching the dielectric layer on both sides and on the bottom of the second initial trench till the first gate structure is exposed to form the top region and the bottom region of the first trench.

In one embodiment, the method for forming the first conductive structure may include: forming an first initial conductive material layer in the first trench and on the dielectric layer; planarizing the first initial conductive material layer till the dielectric layer surface is exposed to form a first conductive material layer; etching back the first conductive material layer till the dielectric layer surface at the bottom of the top region of the first trench is exposed and forming the first conductive structure in the bottom region of the first trench.

Figure 10:
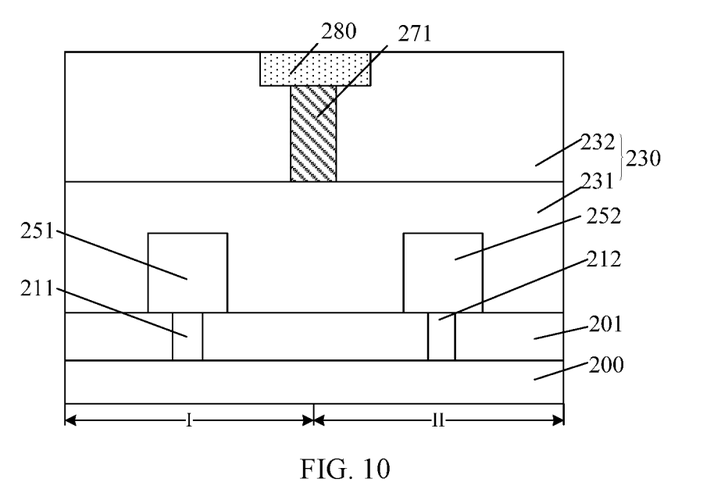

Referring to FIG. 10, after forming the top region 262 of the first trench, an insulation layer 280 may be formed in the top region 262 of the first trench (e.g., in S406 of FIG. 13).

The material of the insulation layer 280 may be different from the material of the dielectric layer 230. At least one insulation layer 280 may be adjacent to another insulation layer 280 of the adjacent device region.

The insulation layer 280 may be made of a material including silicon carbide, silicon nitride, silicon carbonitride or silicon oxycarbide.

The method for forming the insulation layer 280 may include: after forming the first conductive structure 270, forming an initial insulation layer (not shown) in the top region 262 of the first trench and on the surface of the dielectric layer 230; and planarizing the initial insulation layer till the top surface of the dielectric layer 230 is exposed and forming the insulation layer 280 in the top region 262 of the first trench.

The material of the insulation layer 280 may be different from the material of the dielectric layer 230. When the dielectric layer 230 is subsequently etched to form recesses, gases having a large etching selectivity for the dielectric layer 230 and the insulation layer 280 may be selected, which may protect the dielectric layer under the insulation layer 280. The recesses may be formed using the insulation layer as a mask, that is, the position of the insulation layer may determine the position of the second conductive structure, so the difference between the first conductive structure and the second conductive structure may be greater than zero.

The insulation layer 280 may cover the top surface of the first conductive structure 271, which may prevent the first conductive structure 271 from being short-circuited with the second conductive structure formed subsequently.

After forming the insulation layer 280, the second conductive structures may be respectively formed in the dielectric layer 230 on both sides of the first gate structure 220 in the first device region I and the second device region II. The second conductive structures may be respectively connected to the first source/drain doped layer 251 and the second source/drain doped layer 252.

Figure 11:
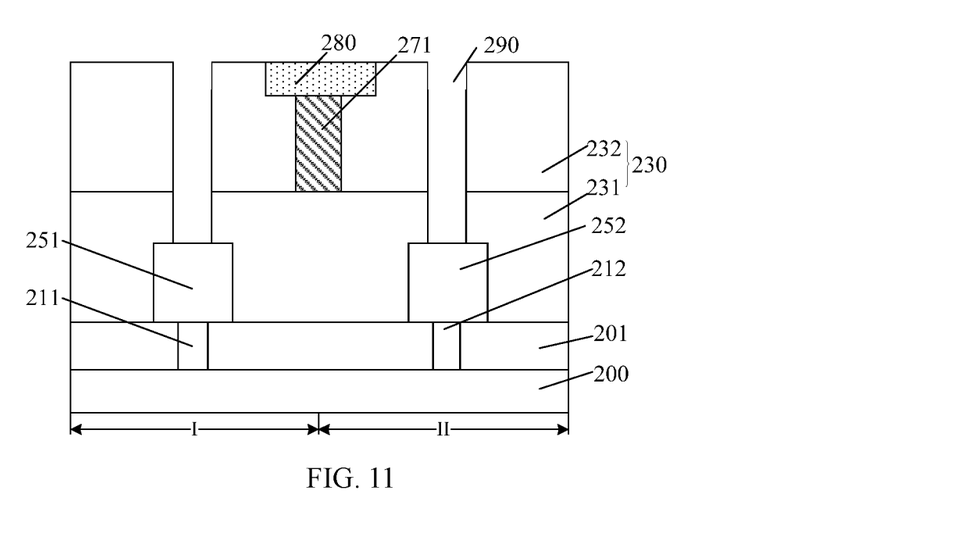

Referring to FIG. 11, after forming the insulation layer 280, recesses 290 may be respectively formed in the dielectric layer 230 on both sides of the first gate structure 220 in the first device region I and the second device region II (e.g., in S407 of FIG. 13).

The method for forming the recesses 290 may include: using the insulation layer 280 as the mask, recesses 290 exposing the first source/drain doped layer 251 and the second source/drain doped layer 252 may be respectively formed in the dielectric layer 230 on both sides of the insulation layer 280.

The method for forming the recesses 290 may further include: forming a second mask layer (not shown) on the dielectric layer 230 and the insulation layer 280, where the second mask layer may cover the top surface of the insulation layer 280 and expose a portion of the surface of the dielectric layer 230; using the second mask layer as the mask, etching the dielectric layer 230 on both sides of the first gate structure 220 till the first source/drain doped layer 251 and the second source/drain doped layer 252 are exposed and forming the recesses 290 in the dielectric layer 230.

For example, the dielectric layer 230 on both sides of the first gate structure 220 in the first device region I may be etched to expose a portion of the top and sidewall surfaces of the first source/drain doped layer 251. The dielectric layer 230 on both sides of the first gate structure 220 in the second device region II may be etched to expose a portion of the top and sidewall surfaces of the second source/drain doped layer 252 and form the recesses 290.

In one embodiment, when etching the dielectric layer 230 on both sides of the first gate structure 220 in the first device region I, the dielectric layer 230 on both sides of the first gate structure 220 in the second device region II may be etched.

In some embodiments, the etching of the dielectric layer 230 on both sides of the first gate structure 220 in the first device region I and the etching of the dielectric layer 230 on both sides of the first gate structure 220 in the second device region II may not be performed simultaneously.

The recesses 290 may provide space for subsequent formation of the second conductive structures.

Figure 12:
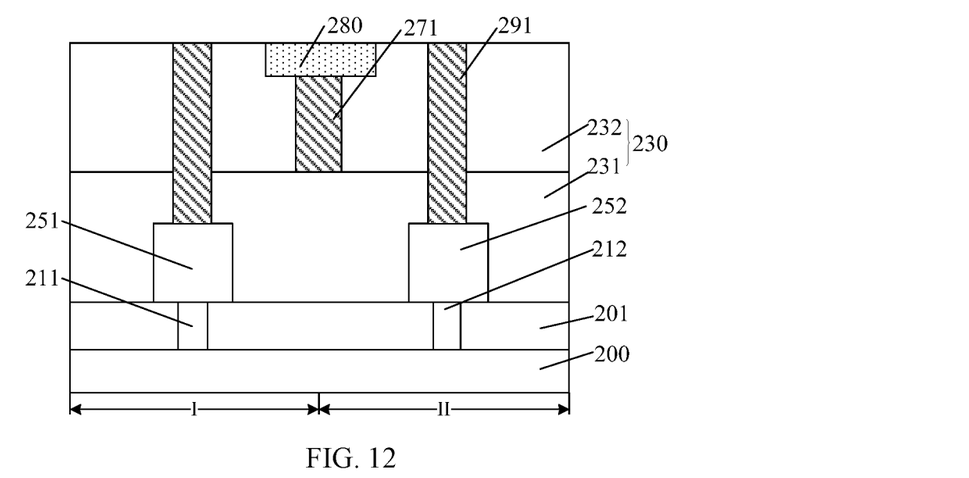
Figure 13:
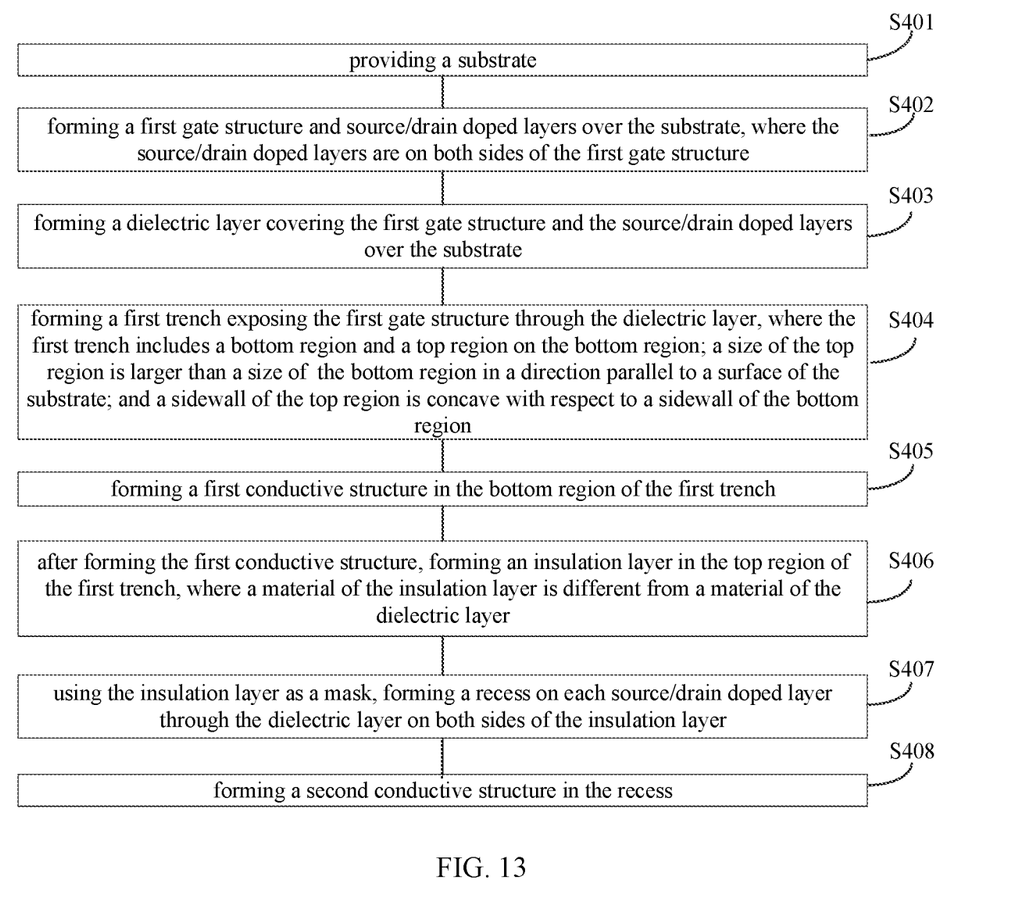
FIG. 13 illustrates a flowchart of an exemplary fabrication method for forming a semiconductor structure according to various disclosed embodiments of the present disclosure.

Referring to FIG. 12, the second conductive structures 291 may be formed in the recesses 291 (e.g., in S408 of FIG. 13) and may be respectively connected to the first source/drain doped layer 251 and the second source/drain doped layer 252.

The second conductive structures 291 may respectively cover a portion of the top surface and sidewall surfaces of the first source/drain doped layer 251 and the second source/drain doped layer 252.

The method for forming the second conductive structure 291 may include: forming a second conductive material layer (not shown) in the recesses 290 and on the dielectric layer 230; planarizing the second conductive material layer till the top surface of the dielectric layer 230 is exposed, and forming the second conductive structures 291 in the recesses 290.

The second conductive structure 291 may be made of a metal including tungsten, cobalt, titanium or nickel.

The forming process of the second conductive material layer may be a deposition process such as a chemical vapor deposition process, a physical vapor deposition process or an atomic layer deposition process.

Before forming the second conductive material layer, the fabrication method may further include forming a metal layer (not shown) on the surfaces and sidewall surfaces of the first source/drain doped layer 251 and the second source/drain doped layer 252 exposed by the recesses 290.

The metal layer may be on the dielectric layer 230.

The metal layer may be made of a material including Ti, Co or Ni.

In one embodiment, the material of the metal layer may be Ti.

The forming process for the metal layer may be a deposition process such as a sputtering process.

After forming the metal layer, an annealing treatment may be performed on the metal layer, the first source/drain doped layer 251 and the second source/drain doped layer 252. A metal silicide layer (not shown) may be formed on the surfaces of the first source/drain doped layer 251 and the second source/drain doped layer 252 exposed by the recesses 290.

In one embodiment, before the subsequent annealing treatment, a blocking layer (not shown) may be formed on the surface of the metal layer. The blocking layer may be made of a material including titanium nitride or tantalum nitride. The forming process for the blocking layer may be deposition process such as a sputtering process.

In one embodiment, the blocking layer may be formed before the annealing treatment. During the annealing treatment, the blocking layer may protect the metal layer and block the annealing treatment from oxidizing the metal layer.

In some embodiments, the blocking layer may be formed after the annealing treatment.

In some embodiments, the blocking layer may not be formed.

The size of the top region of the first trench may be larger than the size of the bottom region of the first trench. The first conductive structure 271 may be formed in the bottom region of the first trench, and the insulation layer 280 may be formed in the top region of the first trench. The insulation layer 280 may cover the top surface of the first conductive structure 271. The materials of the insulation layer 280 and the dielectric layer 230 may be different. During forming the second conductive structure 291, the insulation layer 280 may protect the first conductive structure 271. Meanwhile, the sidewall of the top region of the first trench may be concave with respect to the sidewall of the bottom region of the first trench. Therefore, the distance between the sidewall of the top region of the first trench and the corresponding sidewall of the bottom region of the first trench may be larger than zero, and the thickness of the dielectric layer between the first conductive structure 271 and the second conductive structure 272 may be greater than zero. The sizes of the top region and bottom region of the first trench may be adjusted to better implement the isolation between the first conductive structure 271 and the second conductive structure 272, thereby improving the performance of the semiconductor device.

Correspondingly, the present disclosure also provides a semiconductor device fabricated by any of the above-mentioned embodiments. Referring to FIG. 12, the semiconductor device may include: the substrate; the first gate structure 220 and the source/drain doped layers over the substrate, where the source/drain doped layers may be on both sides of the first gate structure 220; the dielectric layer 230 over the substrate, where the dielectric layer 230 may cover the first gate structure 220 and the source/drain doped layers; the first trench exposing the first gate structure 220 in the dielectric layer 230; the first conductive structure 271 in the bottom region of the first trench; the insulation layer 280 in the top region of the first trench, where the material of the insulation layer 280 may be different from the material of the dielectric layer; and the second conductive structures 291 which may be in the dielectric layer 230 on both sides of the first gate structure 220 and may be connected to the source/drain doped layers. The first trench may include the bottom region and the top region on the bottom region, and the size of the top region may be larger than the size of the bottom region in a direction parallel to a surface of the substrate. The sidewall of the top region may be concave with respect to the sidewall of the bottom region.

The substrate may refer to the above-mentioned embodiments of the present disclosure, which may not be described in detail.

The structure, position and material of the first conductive structure 271 may refer to the above-mentioned embodiments of the present disclosure, which may not be described in detail.

The structure, position and material of the second conductive structure 291 may refer to the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the size of the top region of the first trench may be larger than the size of the bottom region of the first trench. The first conductive structure may be formed in the bottom region of the first trench, and the insulation layer may be formed in the top region of the first trench. The insulation layer may cover the top surface of the first conductive structure. The materials of the insulation layer and the dielectric layer may be different. During forming the second conductive structure, the insulation layer may protect the first conductive structure. Meanwhile, the sidewall of the top region of the first trench may be concave with respect to the sidewall of the bottom region of the first trench. Therefore, the distance between the sidewall of the top region of the first trench and the corresponding sidewall of the bottom region of the first trench may be larger than zero, and the thickness of the dielectric layer between the first conductive structure and the second conductive structure may be greater than zero. The sizes of the top region and bottom region of the first trench may be adjusted to better implement the isolation between the first conductive structure and the second conductive structure, thereby improving the performance of the semiconductor device.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A fabrication method of a semiconductor device, comprising:
   providing a substrate;
   forming a first gate structure and source/drain doped layers over the substrate, wherein the source/drain doped layers are on both sides of the first gate structure;
   forming a dielectric layer covering the first gate structure and the source/drain doped layers over the substrate;
   forming a first trench exposing the first gate structure through the dielectric layer, wherein the first trench includes a bottom region and a top region on the bottom region; a size of the top region is larger than a size of the bottom region in a direction parallel to a surface of the substrate; and a sidewall of the top region is concave with respect to a sidewall of the bottom region;
   forming a first conductive structure in the bottom region of the first trench;
   after forming the first conductive structure, forming an insulation layer in the top region of the first trench, wherein a material of the insulation layer is different from a material of the dielectric layer;
   using the insulation layer as a mask, forming recesses on source/drain doped layers through the dielectric layer on both sides of the insulation layer; and
   forming second conductive structures in the recesses.

2. The method according to claim 1, wherein:
   the dielectric layer is made of a material including silicon oxide, silicon nitride, silicon boronitride, silicon carbon oxynitride, silicon oxynitride, or a combination thereof.

3. The method according to claim 1, wherein:
   the insulation layer is made of a material including silicon carbide, silicon nitride, silicon carbonitride, silicon oxycarbide, or a combination thereof.

4. The method according to claim 1, wherein forming the insulation layer includes:
   forming an initial insulation layer in the top region of the first trench and on the dielectric layer; and
   planarizing the initial insulation layer till exposing a top surface of the dielectric layer to form the insulation layer.

5. The method according to claim 1, wherein:
   in the direction parallel to the surface of the substrate, a ratio of a size of the bottom region of the first trench to a size of the top region of the first trench is about 1:1.4 to about 1:2.6.

6. The method according to claim 1, wherein:
   a difference between the sidewall of the top region of the first trench and the sidewall of the bottom region of the first trench is about 3 nm to about 8 nm.

7. The method according to claim 1, wherein:
   a ratio of a depth of the top region of the first trench to a depth of the first trench is about 1:2 to about 1:7.

8. The method according to claim 1, wherein:
   a depth of the top region of the first trench is about 10 nm to about 50 nm.

9. The method according to claim 1, wherein:
   after forming the top region of the first trench, the bottom region of the first trench is formed.

10. The method according to claim 9, wherein forming the first trench includes:
    forming a first patterned layer on the dielectric layer, wherein the first patterned layer exposes a portion of the dielectric layer surface;
    using the first patterned layer as a mask to etch the dielectric layer to form the top region of the first trench in the dielectric layer;
    removing the first patterned layer to form a second patterned layer on the dielectric layer, wherein the second patterned layer exposes a portion of the dielectric layer surface at a bottom of the top region of the first trench; and
    using the second patterned layer as a mask to etch the dielectric layer to form the bottom region of the first trench in the dielectric layer, wherein the bottom region of the first trench is at the bottom of the top region of the first trench.

11. The method according to claim 1, wherein forming the first trench includes:
    forming a first initial trench in the dielectric layer, wherein the first initial trench exposes the first gate structure;
    forming a sacrificial layer in the first initial trench, wherein a top surface of the sacrificial layer is lower than a top surface of the dielectric layer;
    forming a first mask layer on the dielectric layer, wherein the first mask layer exposes a portion of the dielectric layer surface on both sides of the first initial trench;
    using the first mask layer as a mask, etching the dielectric layer exposed by the first mask layer on both sides of the first initial trench to form the top region of the first trench, wherein a bottom surface of the top region of the first trench is coplanar with the top surface of the sacrificial layer; and
    removing the sacrificial layer to form the bottom region of the first trench after forming the top region of the first trench.

12. The method according to claim 11, wherein:
    the sacrificial layer is made of a material including an organic material.

13. The method according to claim 11, wherein forming the sacrificial layer includes:
    forming an initial sacrificial material layer in the first initial trench and on the dielectric layer;
    planarizing the initial sacrificial material layer till exposing the top surface of the dielectric layer to form an initial sacrificial layer; and
    forming the sacrificial layer by etching back a portion of the initial sacrificial layer.

14. The method according to claim 1, wherein forming the first trench and the first conductive structure includes:
    forming a first initial trench in the dielectric layer, wherein the first initial trench exposes the first gate structure;

forming the first conductive structure in the first initial trench, wherein a top surface of the first conductive structure is lower than a top surface of the dielectric layer, and the first initial trench exposed by the first conductive structure is a first region of the first initial trench; and after forming the first conductive structure, etching the dielectric layer on both sides of the first region of the first initial trench to form the top region of the first trench, wherein a bottom surface of the top region of the first trench is coplanar with the top surface of the first conductive structure, and the first conductive structure is in the bottom region of the first trench.

15. The method according to claim 1, wherein forming the first trench includes:

forming a second initial trench in the dielectric layer; and etching the dielectric layer on both sides and a bottom of the second initial trench till exposing the first gate structure to form the top region and the bottom region of the first trench.

16. The method according to claim 1, wherein forming the first conductive structure includes:

forming a first initial conductive material layer in the first trench and on the dielectric layer;

planarizing the first initial conductive material layer till exposing the dielectric layer surface to form a first conductive material layer; and etching back the first conductive material layer till exposing the dielectric layer surface at a bottom of the top region of the first trench, thereby forming the first conductive structure in the bottom region of the first trench.

17. The method according to claim 1, wherein forming the recesses includes:

forming a second mask layer on the dielectric layer and the insulation layer, wherein the second mask layer covers a top surface of the insulation layer and exposes a portion of the dielectric layer surface on both sides of the first gate structure; and using the second mask layer as the mask to etch the dielectric layer till exposing the source/drain doped layers, thereby forming the recesses in the dielectric layer on both sides of the first gate structure.

18. The method according to claim 1, wherein:

the substrate includes adjacent device regions;

the substrate device region includes a base substrate and first fins on the base substrate, and the first fins of the adjacent device regions are adjacent;

the first gate structure crosses the adjacent first fins of the adjacent device regions and covers a portion of tops and sidewall surfaces of the adjacent first fins; and the source/drain doped layers are in the first fins on both sides of the first gate structure of the device region.

19. A semiconductor device, comprising:

a substrate;

a first gate structure and source/drain doped layers over the substrate, wherein the source/drain doped layers are on both sides of the first gate structure;

a dielectric layer over the substrate, wherein the dielectric layer covers the first gate structure and the source/drain doped layers;

a first trench exposing the first gate structure in the dielectric layer, wherein the first trench includes a bottom region and a top region on the bottom region, a size of the top region is larger than a size of the bottom region in a direction parallel to a surface of the substrate, and a sidewall of the top region is concave with respect to a sidewall of the bottom region;

a first conductive structure in the bottom region of the first trench;

an insulation layer in the top region of the first trench, wherein a material of the insulation layer is different from a material of the dielectric layer; and second conductive structures which are in the dielectric layer on both sides of the first gate structure and are connected to the source/drain doped layers.

20. The semiconductor device according to claim 19, wherein:

the insulation layer covers a top surface of the first conductive structure.

* * * * *